United States Patent
Lin et al.

(10) Patent No.: US 8,232,605 B2
(45) Date of Patent: Jul. 31, 2012

(54) METHOD FOR GATE LEAKAGE REDUCTION AND VT SHIFT CONTROL AND COMPLEMENTARY METAL-OXIDE-SEMICONDUCTOR DEVICE

(75) Inventors: Chien-Liang Lin, Taoyuan County (TW); Yu-Ren Wang, Tai-Nan (TW); Wu-Chun Kao, Taoyuan County (TW); Ying-Hsuan Li, Pingtung (TW); Ying-Wei Yen, Miao-Li Hsien (TW); Shu-Yen Chan, Changhua County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 409 days.

(21) Appl. No.: 12/337,541

(22) Filed: Dec. 17, 2008

(65) Prior Publication Data

US 2010/0148271 A1  Jun. 17, 2010

(51) Int. Cl.
   *H01L 29/76* (2006.01)
(52) U.S. Cl. ........ 257/369; 257/319; 257/392; 257/404; 257/411
(58) Field of Classification Search .................. 257/319, 257/369, 392, 404, 411
   See application file for complete search history.

(56) References Cited

U.S. PATENT DOCUMENTS

| | | | |
|---|---|---|---|
| 5,289,015 A | 2/1994 | Chirovsky | |
| 5,466,612 A | 11/1995 | Fuse | |
| 5,885,861 A * | 3/1999 | Gardner et al. | 438/231 |
| 6,165,265 A | 12/2000 | Gris | |
| 6,277,718 B1 | 8/2001 | Naganuma | |
| 6,358,865 B2 | 3/2002 | Pearce et al. | |
| 6,445,030 B1 | 9/2002 | Wu | |
| 6,541,321 B1 | 4/2003 | Buller | |
| 6,596,570 B2 | 7/2003 | Furukawa | |
| 6,602,751 B2 | 8/2003 | Oohashi | |
| 6,639,264 B1 | 10/2003 | Loh | |
| 6,682,980 B2 | 1/2004 | Chidambaram | |
| 6,720,213 B1 | 4/2004 | Gambino | |
| 6,808,997 B2 | 10/2004 | Jain | |
| 6,831,018 B2 | 12/2004 | Kanegae | |
| 2002/0053316 A1 | 5/2002 | Gris | |
| 2002/0185675 A1 | 12/2002 | Furukawa | |
| 2003/0040192 A1 | 2/2003 | Kanegae | |
| 2003/0098145 A1 | 5/2003 | Tada | |
| 2003/0199128 A1 | 10/2003 | Furukawa | |

(Continued)

OTHER PUBLICATIONS

Toshiba Corporation, "Toshiba Develops Key Technology for Advanced CMOS Fabrication", Toshiba Corporation Corporate Communications Office, Dec. 16, 2004.

*Primary Examiner* — Edward Wojciechowicz
(74) *Attorney, Agent, or Firm* — Winston Hsu; Scott Margo

(57) ABSTRACT

The present invention relates to a method for gate leakage reduction and Vt shift control, in which a first ion implantation is performed on PMOS region and NMOS region of a substrate to implant fluorine ions, carbon ions, or both in the gate dielectric or the semiconductor substrate, and a second ion implantation is performed only on the NMOS region of the substrate to implant fluorine ions, carbon ions, or both in the gate dielectric or the semiconductor substrate in the NMOS region, with the PMOS region being covered by a mask layer. Thus, the doping concentrations obtained by the PMOS region and the NMOS region are different to compensate the side effect caused by the different equivalent oxide thickness and to avoid the Vt shift.

13 Claims, 10 Drawing Sheets

U.S. PATENT DOCUMENTS

| | | |
|---|---|---|
| 2003/0207542 A1 | 11/2003 | Chidambaram |
| 2004/0070046 A1 | 4/2004 | Niimi |
| 2004/0171201 A1 | 9/2004 | Gambino |
| 2004/0173843 A1 | 9/2004 | Noda |
| 2005/0087822 A1 | 4/2005 | Khare |
| 2006/0284249 A1* | 12/2006 | Chen et al. .................... 257/344 |
| 2008/0254642 A1 | 10/2008 | Wang |

* cited by examiner

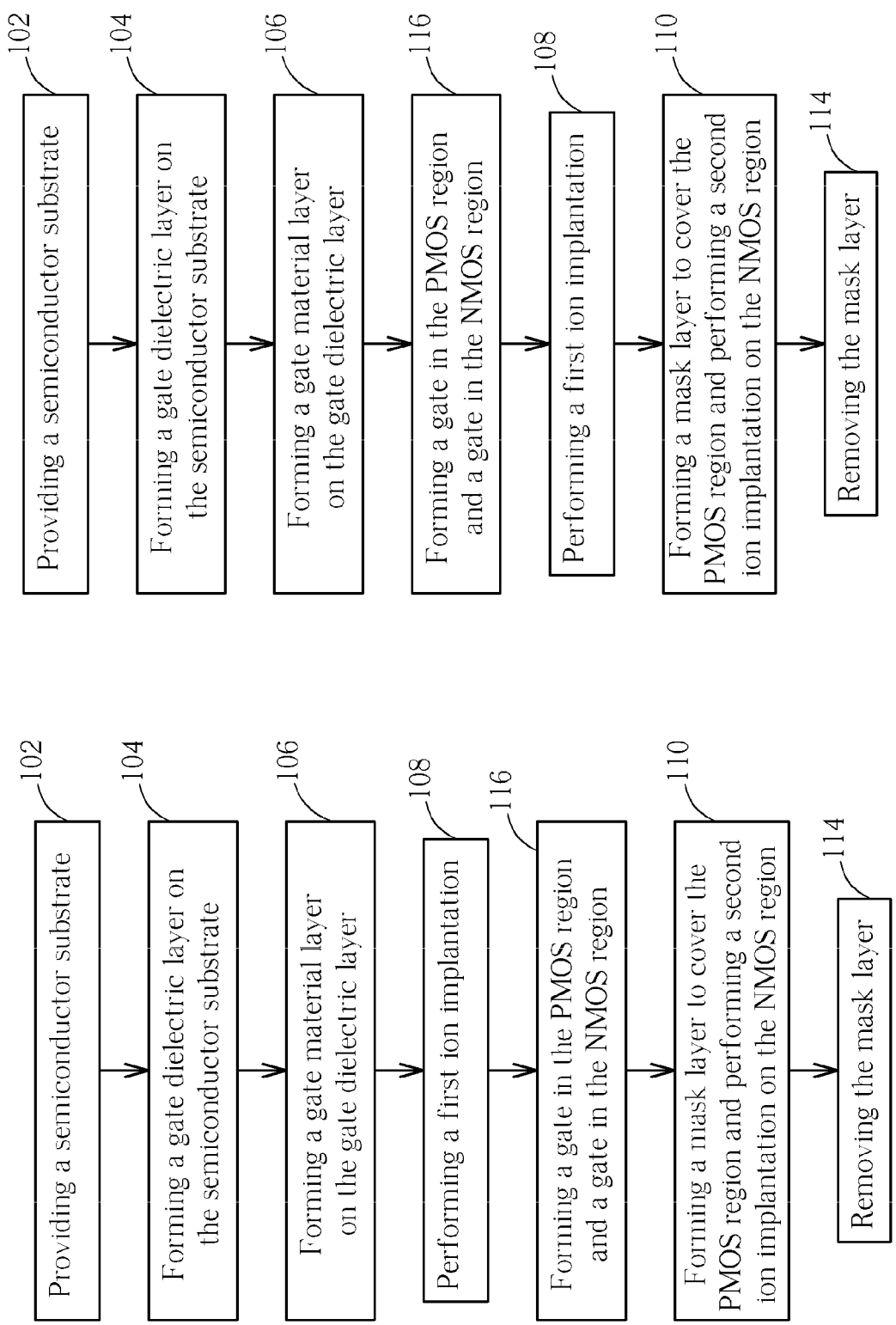

| | | | | Number of wafer | | | | |
|---|---|---|---|---|---|---|---|---|
| DPN | (all 10 kHz) | Time (sec) | 1 | 2 | 3 | 4 | 5 | 6 |
| 10 mTorr, 1000W Peak (200W Eff) (DC: 20%), [N]: 4.0 ×10$^{15}$ atoms/cm$^2$ | | 80 | v | | | | | v |
| 10 mTorr, 2500W Peak (500W Eff) (DC: 20%), [N]: 4.5 ×10$^{15}$ atoms/cm$^2$ | | | | v | v | v | v | |
| PNA | | Time (sec) | | | | | | |
| 1100°C (N$_2$/O$_2$=6/2.4 L/L, 50 Torr) | | 35 | v | v | v | v | v | v |
| Di-Silane Poly 800A In-Situ | | | | | | | | |
| F implantation after poly | | | | | | | | |
| F, 15KeV, 2 ×10$^{15}$ atoms/cm$^2$ | | | | v | | | | |
| F, 15KeV, 2.5×10$^{15}$ atoms/cm$^2$ | | | | | v | | | |
| F, 15KeV, 3 ×10$^{15}$ atoms/cm$^2$ | | | | | | v | | |
| After N$^+$ Poly | | | | | | | | |
| F, 15KeV, 1 ×10$^{15}$ atoms/cm$^2$ | | | | | v | | | |
| F, 15KeV, 2 ×10$^{15}$ atoms/cm$^2$ | | | | v | | v | | |

FIG. 9

METHOD FOR GATE LEAKAGE REDUCTION AND VT SHIFT CONTROL AND COMPLEMENTARY METAL-OXIDE-SEMICONDUCTOR DEVICE

BACKGROUND OF THE INVENTION

1. Field of the Invention

The present invention relates to a technology concerning complementary metal-oxide-semiconductor (CMOS) devices, and particularly to a method for gate leakage reduction and Vt shift control for a CMOS device and a CMOS device made by such method.

2. Description of the Prior Art

Along with MOS device miniaturization, gate dielectric has been scaled aggressively, but gate leakage will be increased while gate dielectric thickness is thinning down. Nitride dose of SiON gate dielectric is increased through a decoupled-plasma nitridation (DPN) treatment to meet the demand of thin gate dielectric with low gate leakage. In other words, the DPN process is used to improve robustness of ultra thin gate dielectrics and to efficiently reduce the gate leakage, as well as to offer a better barrier to boron. However, high nitride dose of SiON gate dielectric will lead the threshold voltage, Vt, of NMOS or PMOS to seriously shift. There are several researches using fluorine implantation after the deposition of polysilicon gate electrode to suppress the side effect, Vt shift.

In other respect, U.S. Pat. No. 6,358,865 discloses a process for the oxidation of a substrate and the formation of oxide regions in the substrate by implantation of fluorine into the silicon lattice and subsequently forming an oxide region by a typical oxide growth process, such as thermal oxidation process. The growth of the oxide region depends on the amount of fluorine implanted into the substrate, the depth which the fluorine is implanted and the energy at which the fluorine is implanted. Therefore, a desired thickness of the oxide region can be obtained by controlling these factors. Furthermore, the process allows for the simultaneous growth of oxides having different thicknesses at the same time. For example, a region having fluorine implanted forms a thick oxide region to serve as a field oxide, and a predetermined region for gate oxide is not implanted with fluorine and will form a thin oxide layer simultaneously to serve as a gate oxide. Issues regarding gate leakage reduction and Vt shift control are not discussed therein.

Suppressing the shift of high nitride dose SiON gate Vt by fluorine implantation after poly-silicon gate electrode deposition is dramatic. Unfortunately, the fluorine implantation after polysilicon gate electrode deposition induces a new problem, that is, the difference between the equivalent oxide thickness (EOT) of the gate dielectric layers of the PMOS transistor and the EOT of the gate dielectric layer of the NMOS transistor will increase with the increase of fluorine implantation after polysilicon gate electrode deposition.

Therefore, there is still a need for a novel method to reduce gate leakage and control Vt, especially in the 45 nm or beyond the technology node.

SUMMARY OF THE INVENTION

The main objective of the present invention is to provide a method for gate leakage reduction and Vt shift control, to effectively reduce gate leakage often encountered by a thin gate dielectric layer and to suppress Vt shift often caused by nitridation of gate dielectric layer, and, in the same time, to avoid the problem induced by the difference of the EOT between the PMOS and the NMOS transistors.

The method for gate leakage reduction and Vt shift control according to the present invention includes steps of providing a semiconductor substrate comprising a P type metal-oxide-semiconductor (PMOS) region and an N type metal-oxide-semiconductor (NMOS) region; forming a gate dielectric layer on the semiconductor substrate; forming a gate material layer on the gate dielectric layer; performing a first ion implantation to implant at least one selected from the group consisting of fluorine ion and carbon ion into the gate dielectric layer or the semiconductor substrate in the PMOS region and the NMOS region; and forming a mask layer to cover the PMOS region and performing a second ion implantation to implant at least one selected from the group consisting of fluorine ion and carbon ion into the gate dielectric layer or the semiconductor substrate.

In another aspect of the present invention, the CMOS device according to the present invention includes a semiconductor substrate comprising a P type metal-oxide-semiconductor (PMOS) region and an N type metal-oxide-semiconductor (NMOS) region; a first gate dielectric layer and a second gate dielectric layer on the semiconductor substrate; a first gate structure and a second gate structure on the first gate dielectric layer and the second gate dielectric layer, respectively; wherein the first gate dielectric layer and the underlying semiconductor substrate together comprises a first dopant of a first concentration, the second gate dielectric layer and the underlying semiconductor substrate together comprises a second dopant of a second concentration, the first dopant and the second dopant each are dependently at least one selected from the group consisting of fluorine ion and carbon ion; and the first concentration and the second concentration are different.

The present invention is characterized in that one implantation is performed on both of the PMOS region and the NMOS region and the second one implantation is only performed on the NMOS region; and accordingly the implant dosages for the PMOS region and the NMOS region are different. The implant dosage in the NMOS region is grater than the implant dosage in the PMOS region; therefore, the difference of EOT between the NMOS region and the PMOS region can be compensated beside the control of Vt shift caused by the DPN process on the gate dielectric layer when a CMOS with low gate leakage or without leakage is made using the method of the present invention.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 7 is a flow chart illustrating still another embodiment of the method for gate leakage reduction and Vt shift control according to the present invention;

FIG. 8 is a flow chart illustrating further still another embodiment of the method for gate leakage reduction and Vt shift control according to the present invention;

FIG. 9 is a table indicating fabrication conditions of CMOS devices in an example according to the present invention;

DETAILED DESCRIPTION

Figure 1:
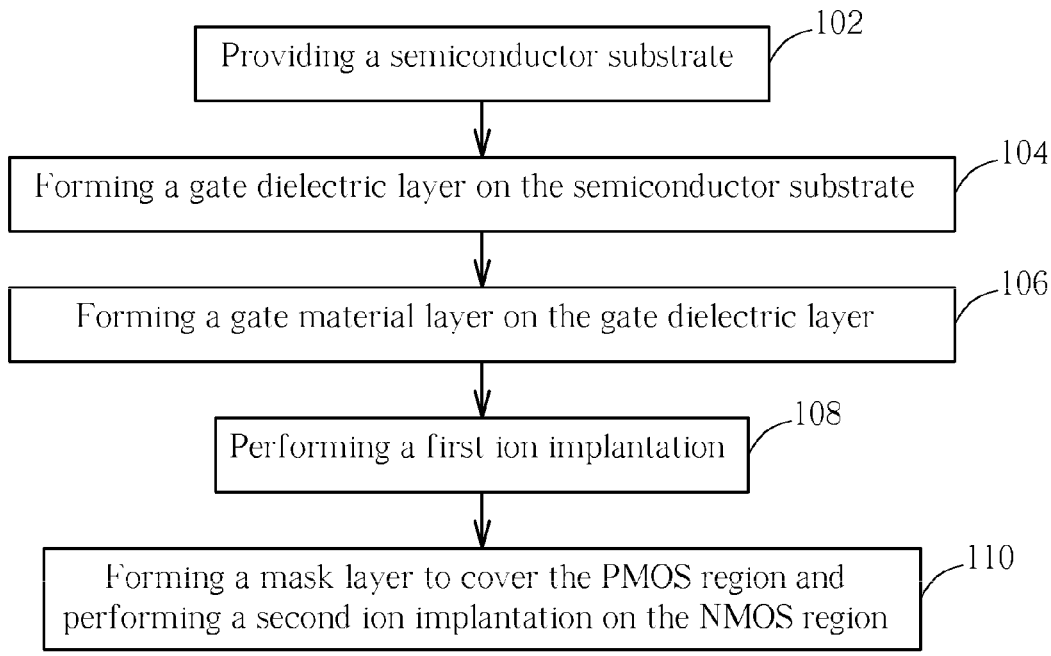
FIG. 1 is a flow chart illustrating the method for gate leakage reduction and Vt shift control according to the present invention.
Figure 2:
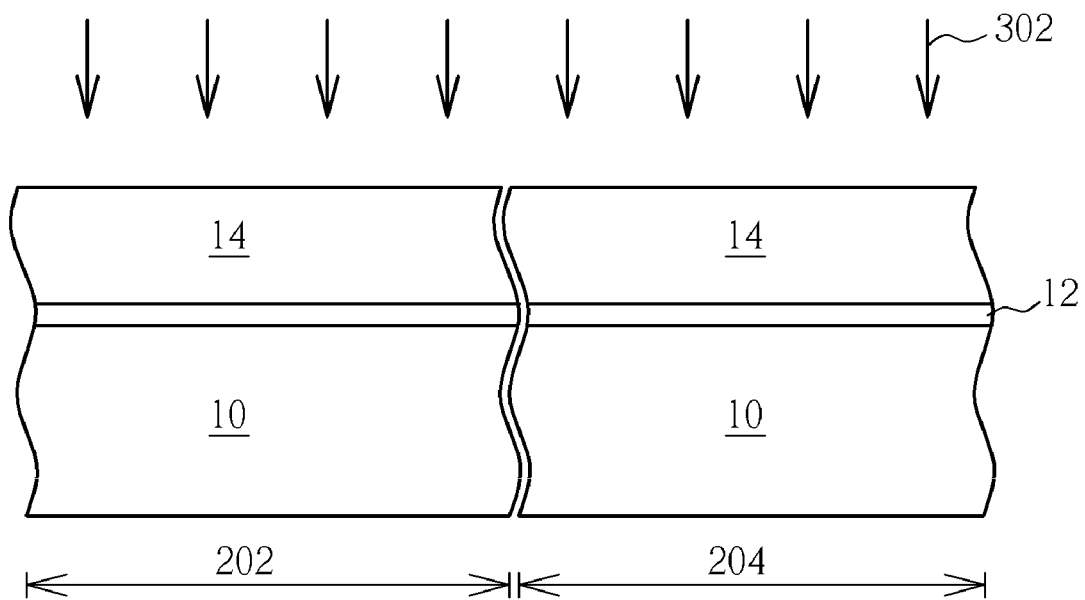
FIGS. 2 and 3 are schematic cross-section views illustrating the method for gate leakage reduction and Vt shift control according to the present invention.
Figure 3:
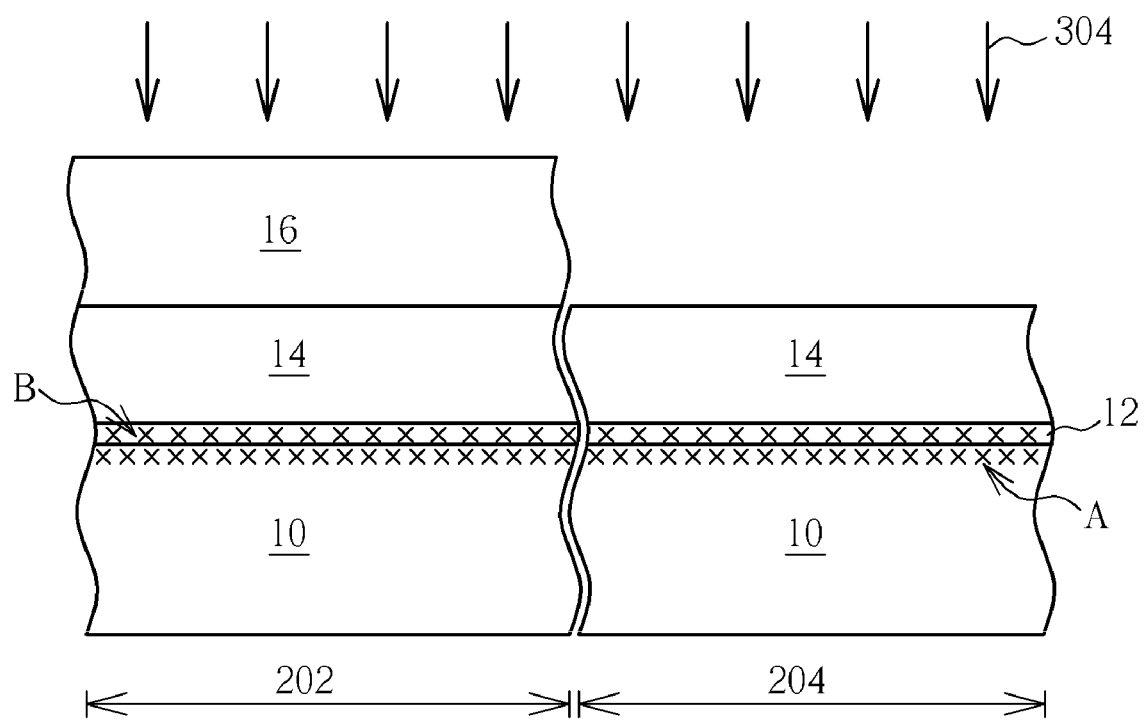

Please refer to FIGS. 1-3 together, which are a flow chart and schematic cross-section views, respectively, illustrating the method for gate leakage reduction and Vt shift control according to the present invention. As shown, the method for gate leakage reduction and Vt shift control includes steps 102, 104, 106, 108, and 110.

Referring to FIGS. 1 and 2, the step 102 is to provide a semiconductor substrate 10 having a PMOS region 202 and an NMOS region 204. The semiconductor substrate may be a silicon wafer, a silicon on insulator (SOI), a silicon on sapphire (SOS), a silicon on zirconia (SOZ), a doped or undoped semiconductor, a silicon epitaxial layer supported by a semiconductor substrate, or the like. The semiconductor is not limited to silicon, but also can be silicon-germanium, germanium, or germanium arsenide. Crystal plane (100) or (111) may be used. The semiconductor substrate in the PMOS region 202 may further include an N well, and the semiconductor substrate in the NMOS region 204 may further include a P well.

The step 104 is to form a gate dielectric layer 12 on the semiconductor substrate 10. The material for the gate dielectric layer 12 is not particularly limited and may be silicon oxide or SiON, which may be further incorporated with nitrogen ions through a DPN process. An oxide layer having an EOT as small as for example 11 angstroms (Å) may be obtained through the DPN process followed by an annealing. Alternatively, a high-k dielectric material, such as hafnium oxide ($HfO_2$) dielectric material, $HfO_2SiN$ dielectric material, HfSiON dielectric material, or the like may be directly used to serve as the gate dielectric layer. Thus, an ultra-thin gate dielectric layer can be made or suitably used for the 45 nm or beyond semiconductor device or process.

The step 106 is to form a gate material layer 14 on the gate dielectric layer 12. The gate material layer 14 may be for example a polysilicon layer and deposited by conventional techniques. The thickness may be as desired.

The step 108 is to perform a first ion implantation 302 without using a patterned photo resist layer, for implanting at least one selected from the group consisting of fluorine ion and carbon ion all over the PMOS region and the NMOS region into the gate dielectric layer 12 or the semiconductor substrate 10. For example, the interface of the gate dielectric layer 12 and the semiconductor substrate 10 and the vicinity of the interface are implanted, but not limited thereto. Since, when the first ion implantation is performed, the gate material layer 14 has been formed on the gate dielectric layer 12, the fluorine ions or carbon ions must be able to pass through the gate material layer 14, so as to reach the gate material layer 12 or the semiconductor substrate 10. The implant energy for fluorine ion implantation may be, for example, 15 KeV, which may depend on the thickness of the gate material layer 14. The implant dosage may be, for example, $2\times10^{15}$ to $3\times10^{15}$ atoms/$cm^2$. The implant energy for carbon ion implantation may also depend on the thickness of the gate material layer 14. Therefore, after the first ion implantation process, the gate dielectric layer 12 or the semiconductor substrate 10 may contain fluorine ions, carbon ions, or both therein. The fluorine ion may be for example $F^+$. The carbon ion may be for example $C^+$.

Thereafter, referring to FIGS. 1 and 3, the step 110 is to form a mask layer 16 covering the PMOS region 202 and thereafter perform a second ion implantation 304 to implant at least one selected from the group consisting of fluorine ion and carbon ion into the gate dielectric layer 12 or the semiconductor substrate 10. Thus, only the gate dielectric layer 12 or the semiconductor substrate 10 in the NMOS region 204 is allowed to be implanted with fluorine ions, carbon ions, or both, and the PMOS region is not implanted due to the mask layer. In the second ion implantation process, the implant energy for fluorine implantation may be, for example, 15 KeV, depending on the thickness of the gate material layer 14, and the implant dosage may be, for example, $1\times10^{15}$ to $2\times10^{15}$ atoms/$cm^2$. The implant energy for carbon implantation may depend on the thickness of the gate material layer 14. The fluorine ion may be for example $F^+$. The carbon ion may be for example $C^+$. The ions used in the first ion implantation and the ions used in the second ion implantation may be same or different. The location for the second ion implantation may be the same as the location of the first ion implantation as possible.

After the second ion implantation is performed, the final implant concentration A obtained by the gate dielectric layer 12 or the semiconductor substrate 10 in the NMOS region 204 is higher than the final implant concentration B obtained by the gate dielectric layer 12 or the semiconductor substrate 10 in the PMOS region 202. The difference between the implant concentrations A and B in the NMOS and PMOS region depend on the thickness of the gate oxide layer in the NMOS region and the thickness of the gate oxide layer in the PMOS region. In an example of the present invention, the Vt increases 6.7 mV when the fluorine implant dosage increases $1\times10^{15}$ atoms/$cm^2$ in the NMOS region, and the Vt increases 20 mV when the fluorine implant dosage increases $1\times10^{15}$ atoms/$cm^2$ in the PMOS region. Therefore, the side effect for different EOT can be effectively compensated through a proper regulation of the difference between the implant dosages of the first and the second implantations. For example, the implant concentration A may be preferably about $1\times10^{15}$ atoms/$cm^2$ to $2\times10^{15}$ atoms/$cm^2$ higher than the implant concentration B for properly compensating the lower EOT in the NMOS region.

Figure 4:
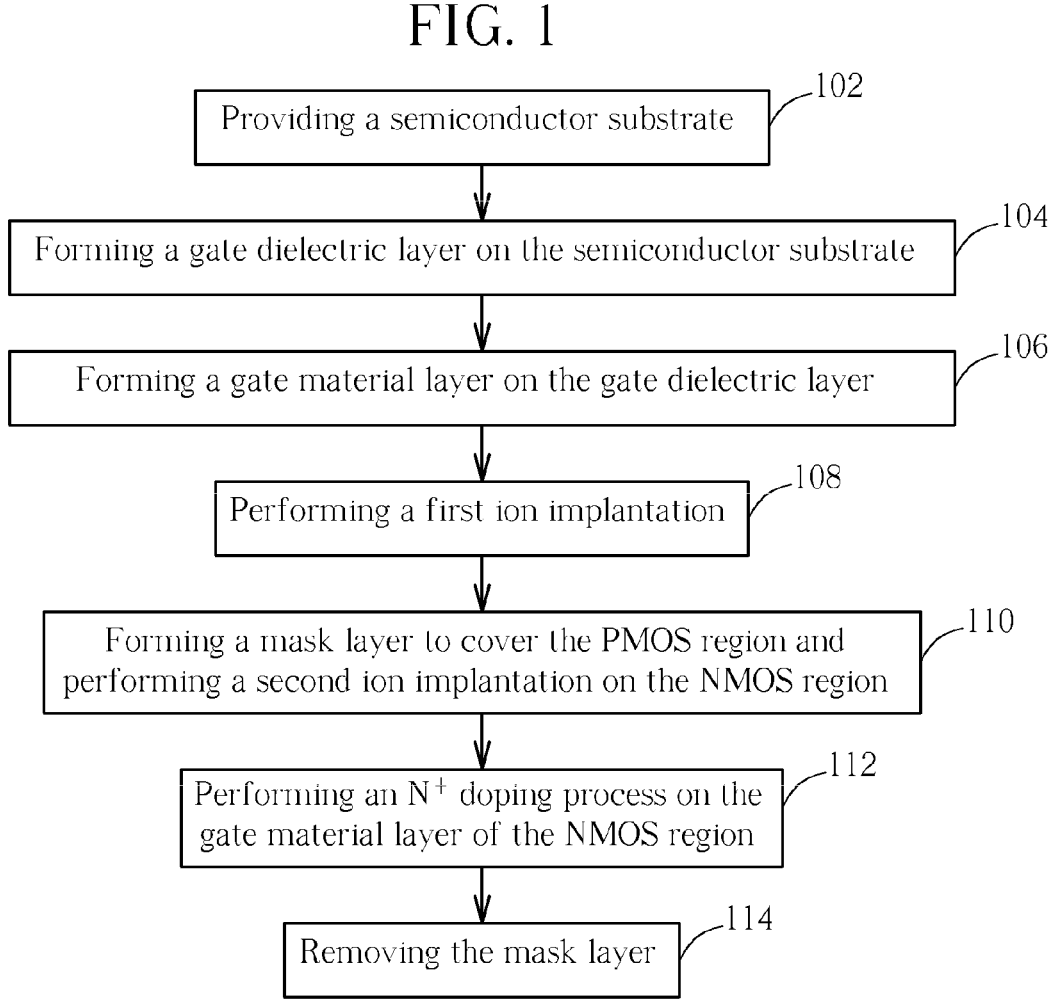
FIG. 4 is a flow chart illustrating an embodiment of the method for gate leakage reduction and Vt shift control according to the present invention.

The mask layer 16 may be for example a photo resist layer, which is formed to cover the PMOS region during the second ion implantation process, such that the second ion implantation is only performed on the NMOS region. The mask layer 16 may be the same one utilized for covering the PMOS region when the gate material layer of the NMOS transistor is being doped. As such, an extra mask layer (such as a photo resist layer) is not needed, and thus the process is convenient. That is, in the flow chart on an embodiment according to the present invention as shown in FIG. 4, after the second ion implantation of the step 110 is performed, the same mask layer 16 may be utilized to shield the PMOS region when the step 112 is carried out to perform an $N^+$ type doping process on the gate material layer 14 in the NMOS region, and, thereafter, the step 114 is performed to remove the mask layer 16.

Figure 5:
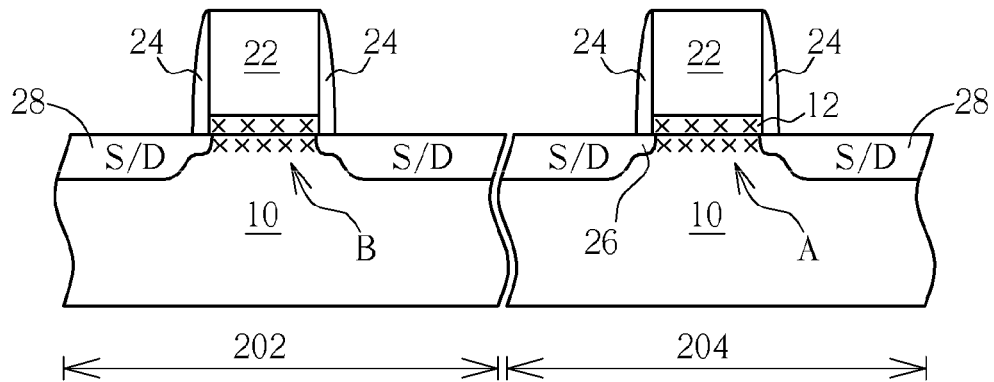
FIG. 5 is a schematic cross-section view illustrating an embodiment of the CMOS device made using the method for gate leakage reduction and Vt shift control according to the present invention.

Finally, referring to FIG. 5, the gate material layer 14 is patterned using for example conventional techniques to form a gate 22 of the PMOS transistor and a gate 22 of the NMOS transistor, and light doped drain (LDD) 26, source/drain regions 28, and spacers 24 are subsequently formed to obtain a CMOS device including the PMOS and NMOS transistors. As such, in the obtained CMOS device, the final implant concentration A received by the gate dielectric layer 12 or the semiconductor substrate 10 in the NMOS region 204 is higher than the final implant concentration B received by the gate dielectric layer 12 or the semiconductor substrate 10 in the PMOS region 202.

Figure 6:
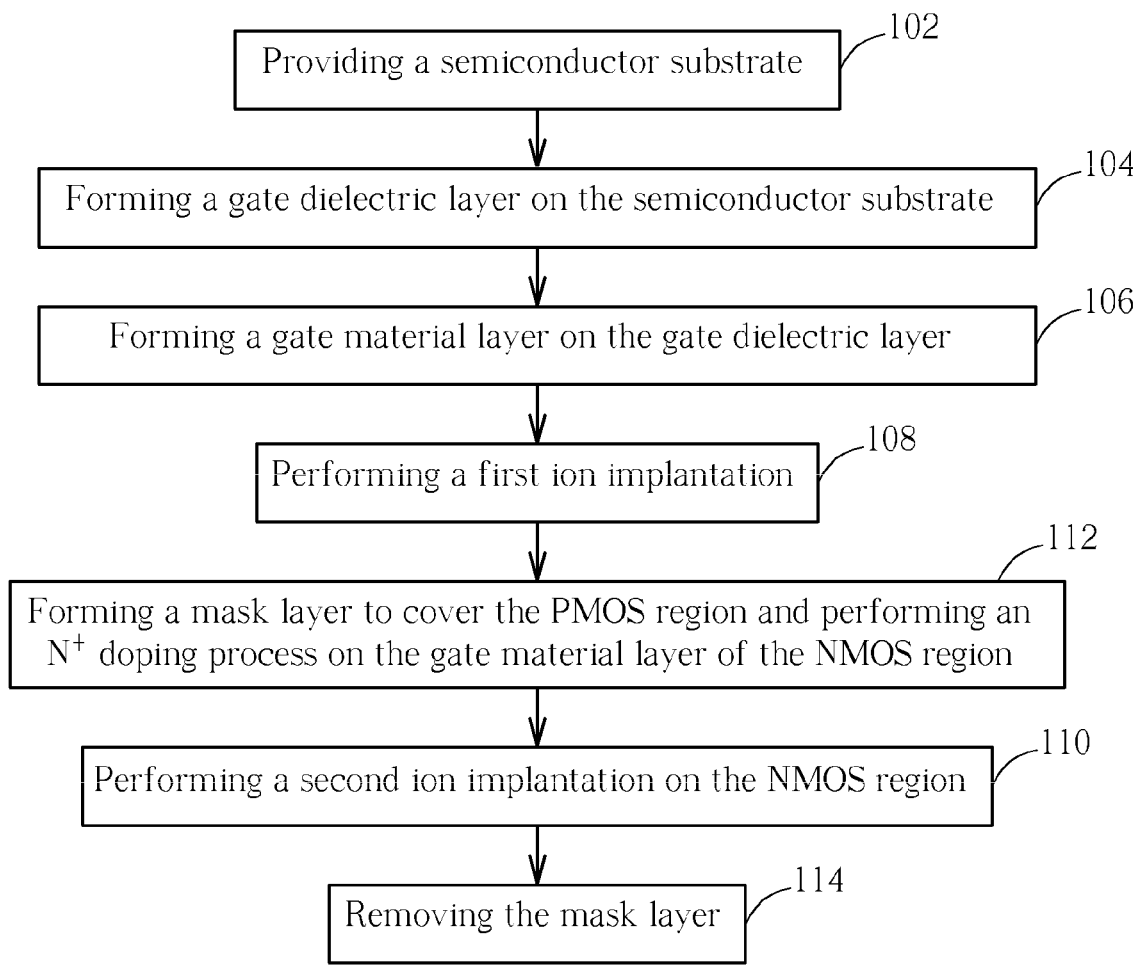
FIG. 6 is a flow chart illustrating another embodiment of the method for gate leakage reduction and Vt shift control according to the present invention.

Alternatively, please refer to FIG. 6 illustrating a flow chart of another embodiment. After the mask layer 16 is formed to cover the PMOS region 202, the step 112 may be carried out first to perform the $N^+$ type doping process on the gate material layer in the NMOS region, and then the step 110 is carried out to perform the second ion implantation 304 to implant at least one selected from the group consisting of fluorine ion and carbon ion passing through the gate material layer 14 into the gate dielectric layer 12 or the semiconductor substrate 10 in the NMOS region. Thereafter, the step 114 is carried out to remove the mask layer 16. Finally, the gate material layer 14 is patterned to form a gate 22 of the PMOS transistor and a gate 22 of the NMOS transistor, and LDD 26, source/drain regions 28, and spacers 24 are subsequently formed to obtain a CMOS device including the PMOS and NMOS transistors.

Alternatively, after the first ion implantation, the mask layer may be formed to cover the PMOS region and the substrate of the NMOS region is subjected to a P type doping process to form a P well. Thereafter, before the mask is removed, the second ion implantation is performed. Accordingly, it is convenient for the manufacturing process that no additional mask layer is needed.

The gate patterning process in the aforementioned embodiment is carried out after the second ion implantation 304 in the step 110 is performed. However, it is not limited thereto according to the spirit and scope of the present invention. The gate patterning process may be performed before the second or the first ion implantation 304 or 302 is performed. FIG. 7 is a flow chart illustrating still another embodiment of the method for gate leakage reduction and Vt shift control according to the present invention. The step 116 is carried out, after the first ion implantation of the step 108 and before the formation of the mask layer on the PMOS region for performing the second ion implantation, to pattern the gate material layer in the PMOS region and the gate material layer in the NMOS region to form gates of the PMOS transistor and the NMOS transistor, respectively.

Alternatively, referring to FIG. 8 illustrating a flow chart of another embodiment according to the present invention, after the gate dielectric layer is form in the step 106 and before the first ion implantation in the step 108 is performed, the step 116 may be carried out to pattern the gate material layer in the PMOS region and the gate material layer in the NMOS region to form gates of the PMOS transistor and the NMOS transistor, respectively.

EXAMPLE

CMOS devices were made on six wafers numbered as #1 to #6 using the method of the present invention. A gate oxide layer with a thickness of 16 Å was formed on each of the wafers #1 to #5, and a gate oxide layer with a thickness of 15 Å was formed on the wafer #6, followed by a DPN process carried out on the gate oxide layers. For the wafer #6, a pressure of 10 mTorr, a power of 1000 W (effective power 200 W (200 W Eff)), duty cycle (DC): 20%, and a nitrogen dosage of $4.0 \times 10^{15}$ atoms/cm$^2$ were used to carry out the DPN process for 80 seconds. For the wafers #1 to #5, a pressure of 10 mTorr, a power of 2500 W (500 W Eff), DC: 20%, and a nitrogen dosage of $4.5 \times 10^{15}$ atoms/cm$^2$ were used to carry out the DPN process. Thereafter, the six wafers were subjected to a post nitridation annealing (PNA) process at 1100° C., with a flow ratio of nitrogen/oxygen being as 6/2.4 L/L, under a pressure of 50 Torr, for 35 seconds. Thereafter, a polysilicon layer with a thickness of 800 Å was formed on each of the wafers using Di-Silane, in situ. After the polysilicon layer was formed, a fluorine ion implantation was performed on each of the wafers #2, #3, #4, and #5, using an implant energy of 15 KeV, and dosages of $2 \times 10^{15}$ atoms/cm$^2$, $2.5 \times 10^{15}$ atoms/cm$^2$, $2.5 \times 10^{15}$ atoms/cm$^2$, and $3 \times 10^{15}$ atoms/cm$^2$, respectively. Thereafter, an $N^+$ doping process was performed on the NMOS regions of the six wafers. Thereafter, another fluorine ion implantation was performed on the NMOS region of each of the wafers #2, #3, and #4 using an implant energy of 15 KeV, and dosages of $2 \times 10^{15}$ atoms/cm$^2$, $1 \times 10^{15}$ atoms/cm$^2$, and $2 \times 10^{15}$ atoms/cm$^2$, respectively. Thereafter, the components such as the gates, the spacers, and the source/drain regions were formed subsequently to form the NMOS and PMOS transistors. The conditions for the fabrication can be referred to the table shown in FIG. 9.

Figure 10:
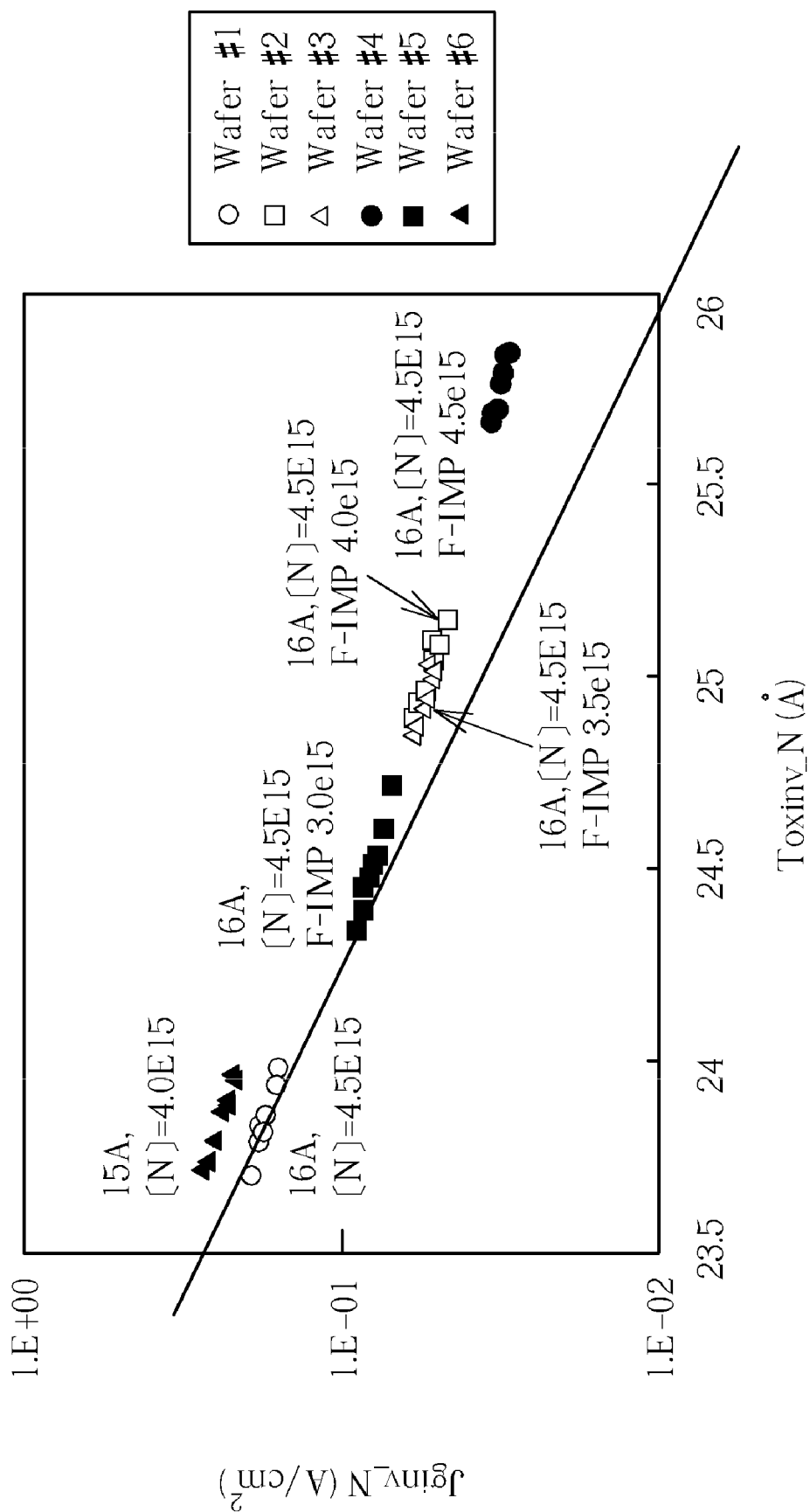
FIG. 10 is a plot of electric current density versus Toxinv of the gate dielectric layer of the NMOS transistor of the CMOS devices obtained in one example according to the present invention.
Figure 11:
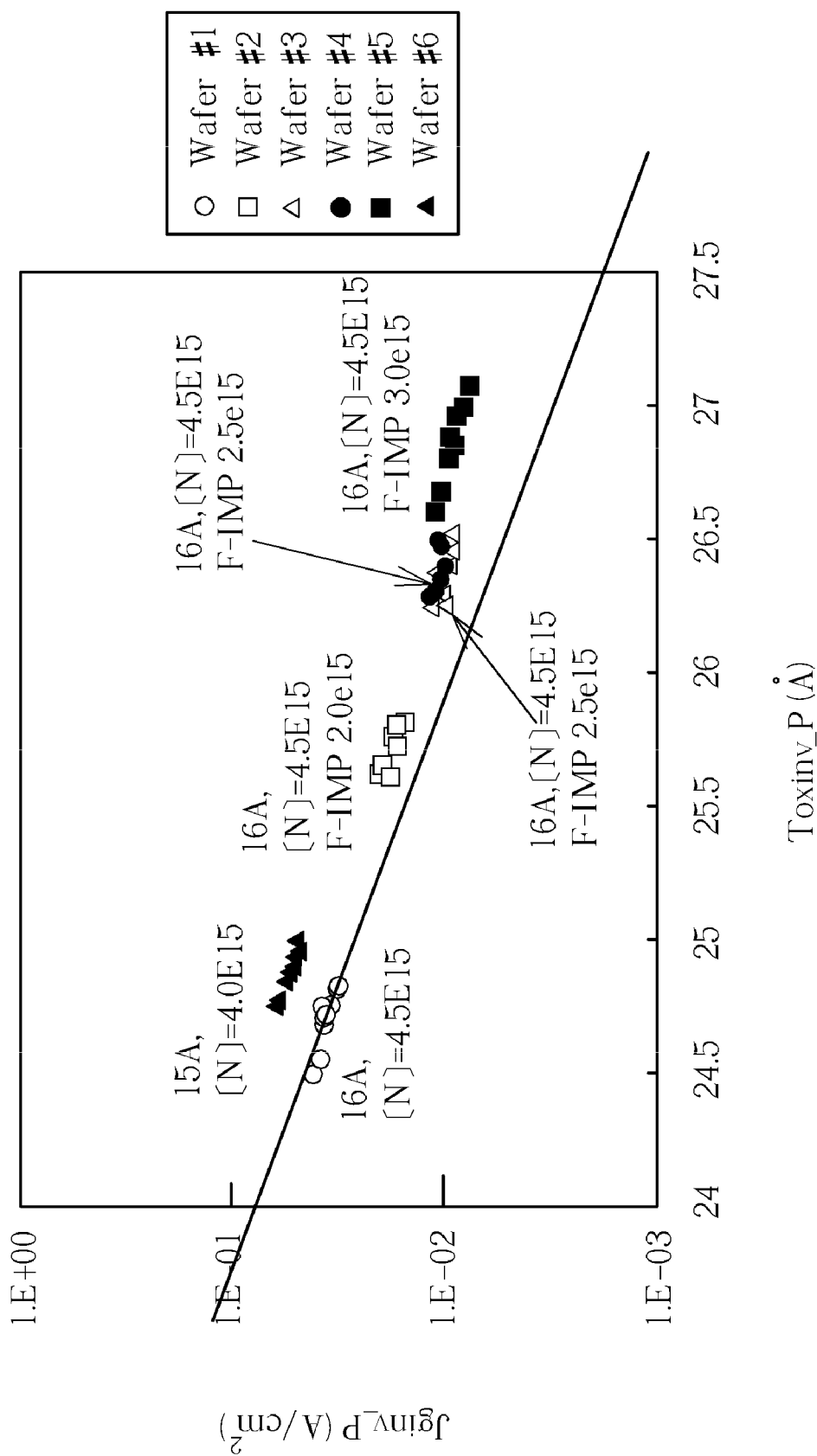
FIG. 11 is a plot of electric current density versus Toxinv of the gate dielectric layer of the PMOS transistor of the CMOS devices obtained in one example according to the present invention.
Figure 12:
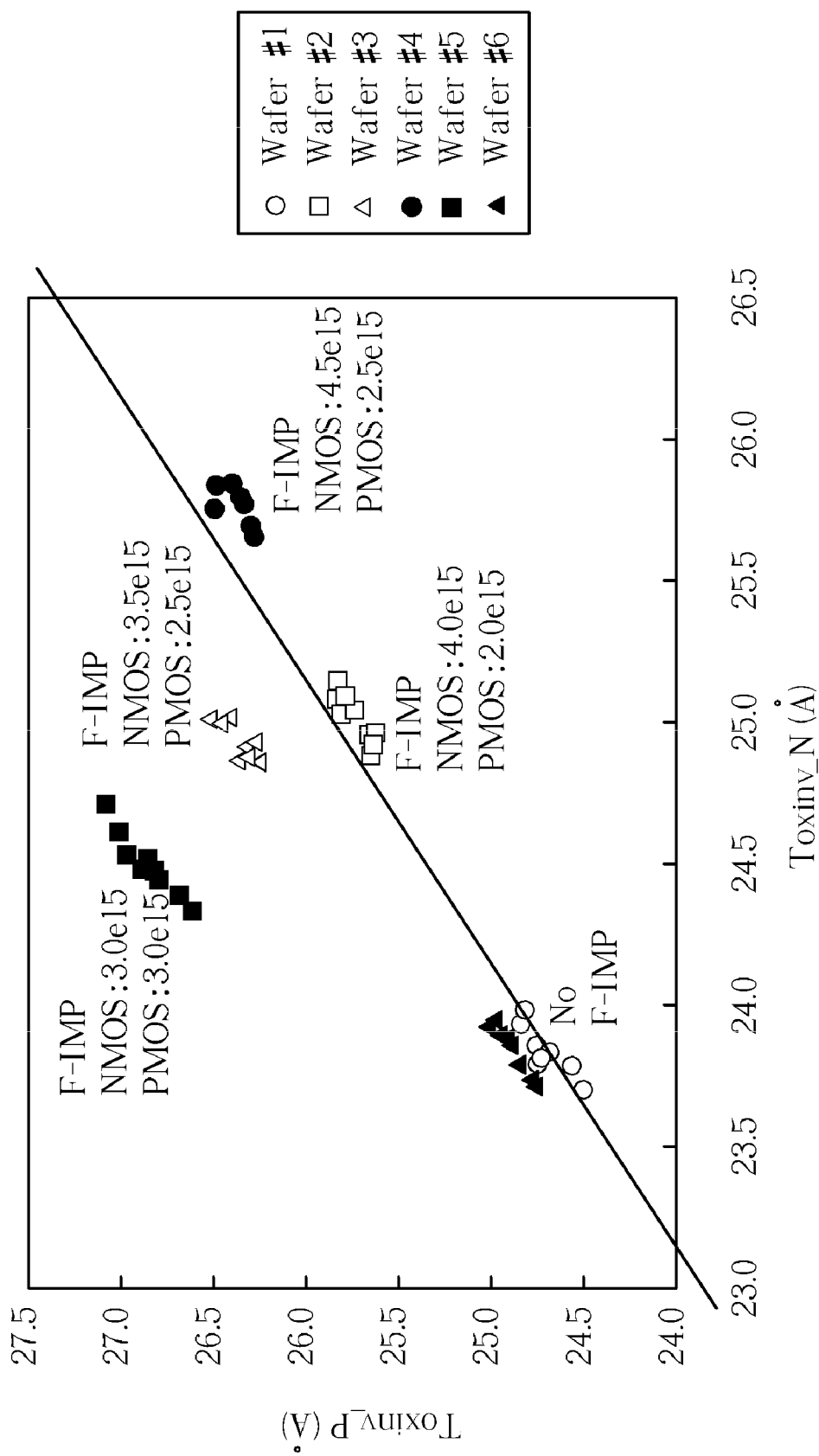
FIG. 12 is a plot of Toxinv of the gate dielectric layer of the PMOS transistor versus Toxinv of the gate dielectric layer of the NMOS transistor of the CMOS devices obtained in one example according to the present invention.

The EOT (referred to as Toxinv_N) (Å) and the electric current density (referred to as Jginv_N) (A/cm$^2$) of the gate oxide layers of the NMOS transistors at the point of inversion were measured, and the EOT (referred to as Toxinv_P) and the electric current density (referred to as Jginv_P) (A/cm$^2$) of the gate oxide layers of the PMOS transistors on the wafers #1 to #6 at the point of inversion were measured using the cyclic voltammetry (CV) method. The electric current density may indicate the gate leakage. Jginv_N was plotted against Toxinv_N as shown in FIG. 10. Jginv_P was plotted against Toxinv_P as shown in FIG. 11. Toxinv_P was plotted against Toxinv_N as shown in FIG. 12.

It can be seen from FIG. 10 that, for the NMOS region, as the nitrogen dosage increases from $4.0 \times 10^{15}$ atoms/cm$^2$ to $4.5 \times 10^{15}$ atoms/cm$^2$, Jginv_N decreases from 0.25 A/cm$^2$ to 0.15 A/cm$^2$. Toxinv_N increases as the dosage of the co-implant fluorine ions increases, with a sensitivity of 0.43 A/$1 \times 10^{15}$ atoms/cm$^2$. The oblique line indicates a plot of the thickness of the gate dielectric layer of the NMOS transistor versus the current density, without the fluorine ion implantation.

It can be seen from FIG. 11 that, for the PMOS region, as the nitrogen dosage increases from $4.0 \times 10^{15}$ atoms/cm$^2$ to $4.5 \times 10^{15}$ atoms/cm$^2$, Jginv_P decreases from 0.05 A/cm$^2$ to 0.04 A/cm$^2$. Toxinv_P increases as the dosage of the co-implant fluorine ions increases, with a sensitivity of 0.71

A/$1\times10^{15}$ atoms/cm$^2$. The oblique line indicates a plot of the thickness of the gate dielectric layer of the PMOS transistor versus the current density, without the fluorine ion implantation.

It can be seen from FIG. 12 that, to compensate the affect caused by the difference of Toxinv_N and Toxinv_P, the dosage of the co-implant fluorine ions in the NMOS region may need to be about $2\times10^{15}$ atoms/cm$^2$ more than that in the PMOS region. The oblique line indicates a plot of the thickness of the gate dielectric layer of the PMOS transistor versus the thickness of the gate dielectric layer of the NMOS transistor, without the fluorine ion implantation.

Figure 13:
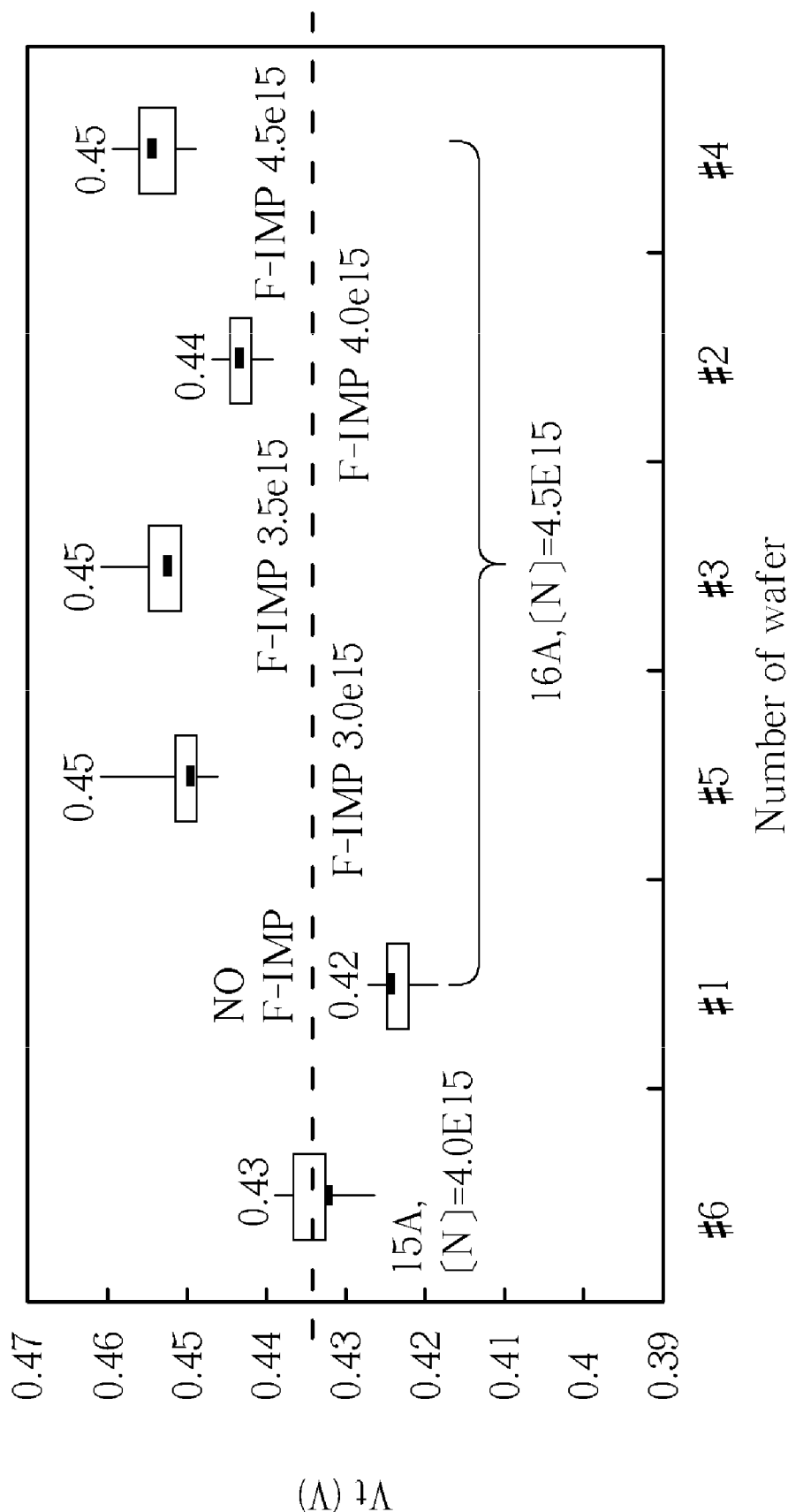
FIG. 13 is a plot of Vt of the NMOS transistor of each wafer versus the number of the wafer in one example according to the present invention.
Figure 14:
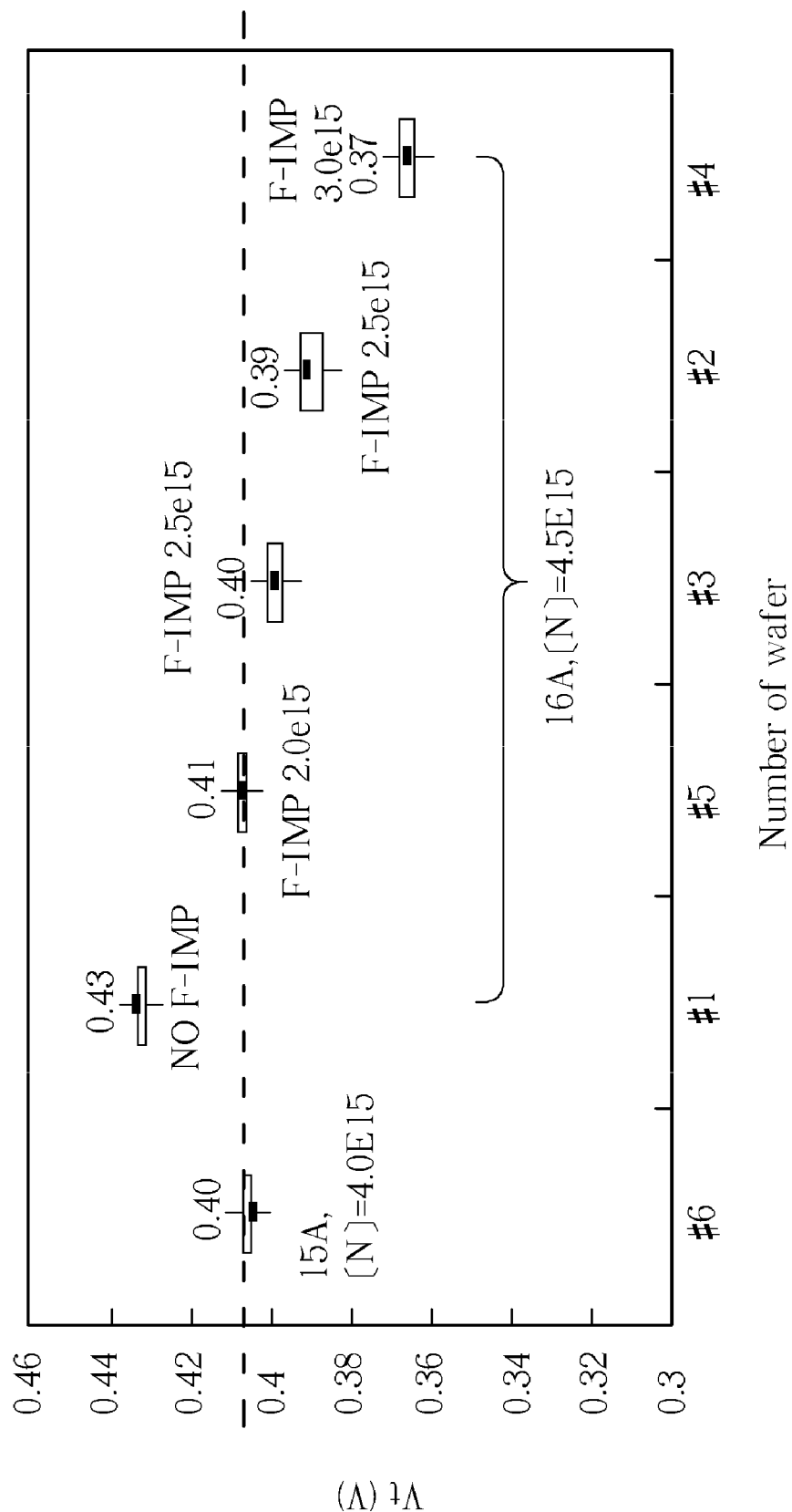
FIG. 14 is a plot of Vt of the PMOS transistor of each wafer versus the number of the wafer in one example according to the present invention.

The Vt of the NMOS transistor (referred to as Vt_N) and the Vt of the PMOS transistor (referred to as Vt_P) of each wafer are further measured, respectively. The Vt of NMOS transistor of each wafer is plotted against the number of the wafer as shown in FIG. 13. The Vt of PMOS transistor of each wafer is plotted against the number of the wafer as shown in FIG. 14. It can be seen from FIG. 13 that as the nitrogen dosage increases from $4.0\times10^{15}$ atoms/cm$^2$ to $4.5\times10^{15}$ atoms/cm$^2$, Vt_N decreases about 10 mV. But, the fluorine ion implantation can increase Vt_N with a sensitivity of 6.7 mV/$1\times10^{15}$ atoms/cm$^2$. Also, it can be seen from FIG. 14 that as the nitrogen dosage increases from $4.0\times10^{15}$ atoms/cm$^2$ to $4.5\times10^{15}$ atoms/cm$^2$, Vt_P increases about 30 mV; while the fluorine ion implantation can increase Vt_P with a sensitivity of 20 mV/$1\times10^{15}$ atoms/cm$^2$.

Those skilled in the art will readily observe that numerous modifications and alterations of the device and method may be made while retaining the teachings of the invention.

What is claimed is:

1. A complementary metal-oxide-semiconductor (CMOS) device, comprising:
    a semiconductor substrate comprising a P type metal-oxide-semiconductor (PMOS) region and an N type metal-oxide-semiconductor (NMOS) region;
    a first gate dielectric layer on the PMOS region and a second gate dielectric layer on the NMOS region of the semiconductor substrate; and
    a first gate structure and a second gate structure on the first gate dielectric layer and the second gate dielectric layer, respectively;
    wherein the semiconductor substrate of the PMOS region comprises a first dopant of a first concentration, the semiconductor substrate of the NMOS region comprises a second dopant of a second concentration, each of the first dopant and the second dopant is selected from the group consisting of fluorine and carbon; and the first concentration of the PMOS region and the second concentration of the NMOS region are different.

2. The CMOS device of claim 1, wherein the first concentration is less than the second concentration.

3. The CMOS device of claim 1, wherein the first dopant and the second dopant each comprise fluorine and the first concentration is less than the second concentration.

4. The CMOS device of claim 1, wherein the first dopant and the second dopant each comprise carbon and the first concentration is less than the second concentration.

5. The CMOS device of claim 1, wherein the first dopant comprises fluorine, the second dopant comprises carbon, and the first concentration is less than the second concentration.

6. The CMOS device of claim 1, wherein the first dopant comprises carbon, the second dopant comprises fluorine, and the first concentration is less than the second concentration.

7. The CMOS device of claim 1, wherein each of the first gate dielectric layer and the second gate dielectric layer comprises SiON and is nitridated through a decoupled plasma nitridation process.

8. The CMOS device of claim 7, wherein the first dopant and the second dopant each comprise fluorine and the first concentration is less than the second concentration.

9. The CMOS device of claim 1, wherein each of the first gate dielectric layer and the second gate dielectric layer comprises a high-k dielectric material.

10. The CMOS device of claim 9, wherein the first dopant and the second dopant each comprise fluorine and the first concentration is less than the second concentration.

11. A complementary metal-oxide-semiconductor (CMOS) device, comprising:
    a semiconductor substrate comprising a P type metal-oxide-semiconductor (PMOS) region and an N type metal-oxide-semiconductor (NMOS) region;
    a first gate dielectric layer on the PMOS region and a second gate dielectric layer on the NMOS region of the semiconductor substrate; and
    a first gate structure and a second gate structure on the first gate dielectric layer and the second gate dielectric layer, respectively;
    wherein the semiconductor substrate of the PMOS region comprises a first dopant comprising fluorine and carbon of a first combined concentration, the semiconductor substrate of the NMOS region comprises a second dopant comprising fluorine and carbon of a second combined concentration, and the first combined concentration of the PMOS region is less than the second combined concentration of the NMOS region.

12. The CMOS device of claim 11, wherein each of the first gate dielectric layer and the second gate dielectric layer comprises SiON and is nitridated through a decoupled plasma nitridation process.

13. The CMOS device of claim 11, wherein each of the first gate dielectric layer and the second gate dielectric layer comprise a high-k dielectric material.

* * * * *